United States Patent
Weber et al.

(10) Patent No.: US 12,328,858 B2
(45) Date of Patent: Jun. 10, 2025

(54) SILICON-ON-INSULATOR SEMICONDUCTOR DEVICE WITH A STATIC RANDOM ACCESS MEMORY CIRCUIT

(71) Applicants: STMicroelectronics France, Montrouge (FR); STMicroelectronics (Crolles 2) SAS, Crolles (FR); STMicroelectronics International N.V., Geneva (CH)

(72) Inventors: Olivier Weber, Grenoble (FR); Kedar Janardan Dhori, Ghaziabad (IN); Promod Kumar, Greater Noida (IN); Shafquat Jahan Ahmed, Greater Noida (IN); Christophe Lecocq, Varces (FR); Pascal Urard, Theys (FR)

(73) Assignees: STMICROELECTRONICS FRANCE, Montrouge (FR); STMICROELECTRONICS (CROLLES 2) SAS, Crolles (FR); STMICROELECTRONICS INTERNATIONAL N.V., Geneva (CH)

( * ) Notice: Subject to any disclaimer, the term of this patent is extended or adjusted under 35 U.S.C. 154(b) by 106 days.

(21) Appl. No.: 18/347,435

(22) Filed: Jul. 5, 2023

(65) Prior Publication Data

US 2024/0015945 A1    Jan. 11, 2024

(30) Foreign Application Priority Data

Jul. 6, 2022    (FR) ...................................... 2206897

(51) Int. Cl.
*G11C 11/417* (2006.01)
*H10B 10/00* (2023.01)

(52) U.S. Cl.
CPC ............ *H10B 10/12* (2023.02); *G11C 11/417* (2013.01); *H10B 10/18* (2023.02)

(58) Field of Classification Search
CPC ...... H10B 10/12; H10B 10/18; H10B 10/125; G11C 11/417; H10D 30/0323; H10D 30/6744; H10D 86/201
(Continued)

(56) References Cited

U.S. PATENT DOCUMENTS

| 2014/0173544 A1 | 6/2014 | Giraud et al. |
| 2016/0078924 A1 | 3/2016 | Thomas et al. |

(Continued)

FOREIGN PATENT DOCUMENTS

| EP | 3002788 A2 | 4/2016 |
| EP | 3002788 A3 | 6/2016 |
| FR | 3017744 A1 | 8/2015 |

*Primary Examiner* — Michael T Tran
(74) *Attorney, Agent, or Firm* — Slater Matsil, LLP (57) ABSTRACT

In one embodiment, a semiconductor device includes a carrier substrate, a buried dielectric region overlying the carrier substrate, and a semiconductor film separated from the carrier substrate by the buried dielectric region. NMOS transistors and PMOS transistors are disposed at a surface of the semiconductor film and coupled together to form a static random access memory (SRAM) cell. The NMOS transistors and the PMOS transistors each include a gate dielectric layer having a thickness greater than three nanometers and an active region in the semiconductor film. The active region of the PMOS transistors are formed from a silicon-germanium alloy.

22 Claims, 5 Drawing Sheets (58) Field of Classification Search
USPC .................................................. 365/154, 205
See application file for complete search history.

(56) References Cited

U.S. PATENT DOCUMENTS

| | | | |
|---|---|---|---|
| 2019/0238134 A1* | 8/2019 | Lee ..................... | H01L 23/5389 |
| 2021/0343693 A1* | 11/2021 | Chang ................... | H01L 24/14 |
| 2021/0366877 A1* | 11/2021 | Wu ..................... | H01L 23/5384 |
| 2021/0375785 A1* | 12/2021 | Wu ..................... | H01L 21/4857 |

* cited by examiner

SILICON-ON-INSULATOR SEMICONDUCTOR DEVICE WITH A STATIC RANDOM ACCESS MEMORY CIRCUIT

CROSS REFERENCE TO RELATED APPLICATIONS

This application claims the benefit of French Patent Application No. 2206897, filed on Jul. 6, 2022, which application is hereby incorporated herein by reference.

TECHNICAL FIELD

Implementations and embodiments relate to the semiconductor devices of the silicon on insulator type, for example, implementing a static RAM circuit.

BACKGROUND

The semiconductor devices of the silicon on insulator type, usually made inside an integrated circuit, typically comprise a semiconductor film separated from a carrier substrate by a buried dielectric region. For example, the semiconductor film advantageously has a thickness sufficiently fine to be completely depleted of minority charges, in a technology called FDSOI (for Fully Depleted Silicon On Insulator).

Conventionally, static RAMs (usually SRAM for Static Random Access Memory) include memory cells provided with two PMOS transistors and two NMOS transistors (usual designations well known to a person skilled in the art for "p-type/n-type metal oxide semiconductor") connected between a power supply terminal and a ground terminal so as to form two top to tail inverters, as well as typically two access transistors, usually NMOS transistors, coupled between bit lines and the data nodes (that is to say the nodes of inputs-outputs of the inverters) and controlled by a signal transmitted on a word line.

The writing and the reading of a piece of data in an SRAM cell are carried out via the access transistors and the bit lines, by imposing when writing, or by measuring when reading, a voltage level on the data nodes. The retention of a piece of data in a memory cell is obtained by the steady state of the signal generated on the data nodes of the assembly of the top to tail inverters.

In the "write-read" mode, the power supply voltage is generated at a nominal level, that is to say a normal operating level of the transistors, for example between 0.8 volts and 1.2 volts for semiconductor devices of the silicon on insulator type, in order to have a well-defined and discernible steady state in the memory cell.

In the "retention" mode of an SRAM cell, it is advantageous to reduce as much as possible the energy consumption of the device. The power supply voltage can be minimized but nevertheless remains greater than the threshold voltages of the transistors of the cell, to not lose the steady state of the SRAM cell and the piece of data thus retained. It is therefore desirable to propose SRAM memory cell technologies having the smallest possible current leaks. The FDSOI technologies with the highest performance in terms of current leaks (usually called ULL for "Ultra Low Leakage") have results of approximately 1 picoampere (or woo femtoamperes) in the retention mode.

SUMMARY

Embodiments propose SRAM memory technologies that have an even lower energy consumption, for example, in the data retention mode.

In one embodiment, a semiconductor device includes a carrier substrate, a buried dielectric region overlying the carrier substrate, and a semiconductor film separated from the carrier substrate by the buried dielectric region. NMOS transistors and PMOS transistors are disposed at a surface of the semiconductor film and coupled together to form a static random access memory (SRAM) cell. The NMOS transistors and the PMOS transistors each include a gate dielectric layer having a thickness greater than three nanometers and an active region in the semiconductor film. The active region of the PMOS transistors are formed from a silicon-germanium alloy.

Another embodiment provides a method of operating a static random access memory formed from NMOS transistors and PMOS transistors disposed a surface of a semiconductor film that is separated from a carrier substrate by a buried dielectric region. The NMOS transistors and the PMOS transistors each comprise a gate dielectric layer having a thickness greater than 3 nanometers and an active region in the semiconductor film. The active region of the PMOS transistors comprises a silicon-germanium alloy. The method comprises operating the memory in a read-write mode and operating the memory in a retention mode. The NMOS transistors and the PMOS transistors are back biased to a nominal voltage in the read-write mode and the NMOS transistors and the PMOS transistors are back biased to a voltage that is 50% to 85% of the nominal voltage in the retention mode.

Another embodiment provides method of forming a semiconductor device in a semiconductor film separated from a carrier substrate by a buried dielectric region. The method comprises forming NMOS transistors and PMOS transistors at a surface of the semiconductor film and coupling the NMOS transistors and the PMOS transistors together to form a plurality of static random access memory (SRAM) cells. The NMOS transistors and the PMOS transistors each comprise a gate dielectric layer having a thickness greater than 3 nanometers. The NMOS transistors comprise an active region of silicon in the semiconductor film and the PMOS transistors comprise an active regions of a silicon-germanium alloy in the semiconductor film.

BRIEF DESCRIPTION OF THE DRAWINGS

Other advantages and features of the invention will appear upon examination of the detailed description of implementations and embodiments, in no way limiting, and of the appended drawings, in which.

DETAILED DESCRIPTION OF ILLUSTRATIVE EMBODIMENTS

Embodiments will first be described in text followed by illustration of examples with respect to the drawings.

According to one aspect, in this regard a semiconductor device of the silicon on insulator type comprising a semiconductor film separated from a carrier substrate by a buried dielectric region is proposed. The device comprises a static RAM circuit provided with at least one cell-memory including NMOS transistors and PMOS transistors, each comprising a gate dielectric layer having a thickness greater than 3 nanometers and an active region in the respective semiconductor film. The active region of the PMOS transistors is made of a silicon-germanium alloy.

The thickness, greater than 3 nanometers, of the gate dielectric layer of the transistors is large with respect to the typical SRAM memory architectures using FDSOI technology. Indeed, the thicknesses of the gate dielectric layers are conventionally 1 nanometer to 1.5 nanometers. Consequently, the memory cell defined according to this aspect has extremely small gate current leaks. However, the memory cell according to this aspect can have a bulk greater than in a conventional architecture (thickness from 1 nm to 1.5 nm), and furthermore the threshold voltages of the NMOS and PMOS transistors are greater than in a conventional architecture (thickness from 1 nm to 1.5 nm). The active region of the PMOS transistors made of a silicon-germanium alloy, having in particular a compression stress in the direction of the channel (source-drain) of the transistor, allows to lower the threshold voltage of the PMOS transistors and thus to have suitable performance, in particular in terms of stability in read-write mode, without increasing the power supply voltages. The increase in the threshold voltage of the NMOS transistors advantageously allows to reduce the leaks of currents towards the ground by the conduction regions of the NMOS transistors.

The term "active region", in the manner usual and well-known to a person skilled in the art, is meant as designating regions of the semiconductor films that are not covered by lateral isolation regions, such as shallow isolation trenches (usually Shallow Trench Isolation), so that interfaces between the gate regions and the channel regions, as well as the source and drain regions of the transistors, are formed in said active regions.

According to one implementation, the gate dielectric layers of the NMOS transistors and of the PMOS transistors have a thickness, taken between the active region and a gate conductive region, between 3.5 nanometers and 6 nanometers.

For example, the gate dielectric layers of the NMOS transistors and of the PMOS transistors include a part made of silicon oxide, for example made of "SiON" silicon oxynitride (or $SiO_xN_y$, typically $Si_2O_2N$), having a thickness between 1 nanometer and 3.5 nanometers, and optionally a part made of "high permittivity" (usually "high-k") dielectric, such as hafnium oxide, having a thickness of substantially 2.5 nanometers, located above the part made of silicon oxide, in particular in the technologies called "high-k/metal gate", that is to say, the technologies including the "high permittivity" dielectric and a part made of metal in the gate conductive region.

The total thicknesses of the gate dielectric layers, between 3.5 nm and 6 nm, can for example correspond to gate dielectrics of "medium voltage" transistors intended to operate at voltages of up to 1.8 volts, contrary to the conventional architectures (from 1 nm to 1.5 nm) corresponding to gate dielectrics of "low voltage" transistors intended to operate at voltages lower than 1.2 volts.

Circuits other than the static RAM circuit belonging to the semiconductor device can incorporate "medium voltage" transistors, that is to say transistors having gate dielectric layers having thicknesses between 3.5 nm and 6 nm and intended to operate at voltages between 1.2 volts and 1.8 volts, and optionally incorporate "low voltage" transistors, that is to say transistors having gate dielectric layers having thicknesses between mm and 1.5 nm and intended to operate at voltages between 0.5 volts and 1.2 volts.

According to one implementation, the active regions extend in the memory circuit along a first direction so as to incorporate other cell-memories, and so as to not relax a compression stress in the first direction of the silicon-germanium alloy.

This corresponds to a "continuous active region" architecture for the PMOS transistors, which allows to take advantage of the compression stress in the length of the channel of the PMOS transistors, but which engenders by construction the presence of an additional transistor, called "gate tied," advantageously connected to be always deactivated.

Moreover, the first direction corresponds to the length of the channel of the transistor, that is to say the direction between the source and the drain of the transistor.

According to one implementation, the NMOS transistors and the PMOS transistors are located in respectively doped wells of the carrier substrate, the device including a bias circuit configured to generate, in the respective semiconductor wells of the carrier substrate, voltages adapted for reverse back biases of the PMOS and NMOS transistors.

The back bias voltages create a field effect in the active region engendered by the bias of the carrier substrate under the buried dielectric region. The reverse back bias allows to "slow down" the operation of the transistors by increasing their threshold voltages and to reduce the current leaks in the channel of the transistors.

According to one implementation, the NMOS transistors are located in an p-type doped well in the carrier substrate, the PMOS transistors are located in an n-type doped well in the carrier substrate, and the bias circuit is configured to generate a reverse back bias voltage between 0 volts and −2 volts in the p-type doped wells, and a reverse back bias voltage between 0 volts and +2 volts in the n-type doped wells.

According to one implementation, the bias circuit is configured to generate said voltages adapted for reverse back biases of the PMOS and NMOS transistors, in a mode for retention of a piece of data of said cell-memory and not in a read-write mode of said cell-memory, the bias circuit being configured to generate a power supply voltage for said cell-memory having a nominal level in the read-write mode, and having 50% to 85% of the nominal level in the mode for retention of a piece of data.

According to another aspect, a method for manufacturing a semiconductor device of the silicon on insulator type comprising a semiconductor film separated from a carrier substrate by a buried dielectric region is proposed. At least one cell-memory of a static RAM circuit comprising NMOS transistors and of PMOS transistors is manufactured. The method comprises the formation of an active region in the respective semiconductor film and the formation of a gate dielectric layer having a thickness greater than 3 nanometers. The active region of the PMOS transistors are made of a silicon-germanium alloy.

According to one embodiment, the gate dielectric layers of the NMOS transistors and of the PMOS transistors have a thickness, taken between the active region and a gate conductive region, between 3.5 nanometers and 6 nanometers.

According to one embodiment, the active regions are made by being extended in the memory circuit along a first direction so as to incorporate other cell-memories, and so as to not relax a compression stress in the first direction of the silicon-germanium alloy.

According to one embodiment, the manufacturing of the NMOS transistors and of the PMOS transistors comprises a formation of respectively doped semiconductor wells in the carrier substrate, the PMOS and NMOS transistors being located in the wells having a respective type of doping, the method further comprising a manufacturing of a bias circuit capable of generating, in the respective semiconductor wells of the carrier substrate, voltages adapted for reverse back biases of the PMOS and NMOS transistors.

According to one embodiment, the wells in which the NMOS transistors are located have p-type doping, the wells in which the PMOS transistors are located have n-type doping, and the bias circuit is manufactured so as to generate a reverse back bias voltage between 0 volts and −2 volts in the p-type doped wells, and a reverse back bias voltage between 0 volts and +2 volts in the n-type doped wells.

According to one embodiment, the bias circuit is manufactured so as to generate said voltages adapted for reverse back biases of the PMOS and NMOS transistors, in a mode for retention of a piece of data of said cell-memory and not in a read-write mode of said cell-memory, the bias circuit being manufactured so as to generate a power supply voltage for said cell-memory having a nominal level in the read-write mode, and having 50% to 85% of the nominal level in the mode for retention of a piece of data.

Reference will now be made with respect to the figures.

Figure 1:
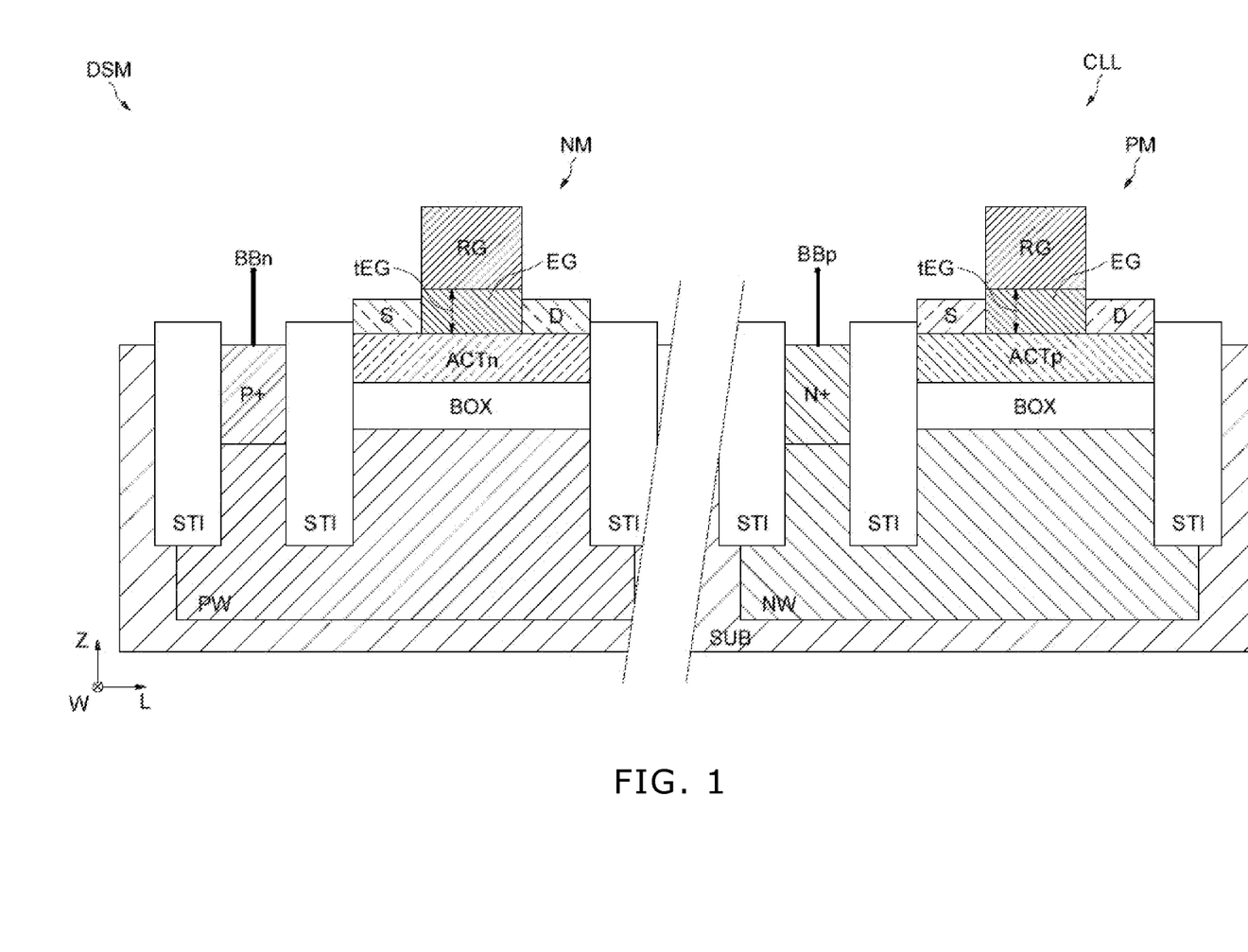
FIG. 1 schematically illustrates a semiconductor device DSM of the silicon on insulator type.

FIG. 1 schematically illustrates a semiconductor device DSM of the silicon on insulator type, comprising a transistor NM of the NMOS type and a transistor PM of the PMOS type, which will be designated below by the terms "NMOS transistor" and "PMOS transistor."

In silicon on insulator technology, the NMOS transistors and the PMOS transistors are made from a substrate structure including a semiconductor film ACTn, ACTp separated from a carrier substrate SUB by a buried dielectric region BOX.

The NMOS and PMOS transistors are in particular adapted to integrate cell-memories CLL of an ultra low leakage "SRAM" static RAM circuit.

In this respect, the NMOS transistors and the PMOS transistors each comprise in particular a gate dielectric layer, or "region," EG having a thickness tEG greater than 3 nanometers, and, also in particular, the PMOS transistor includes an active region ACTp in the respective semiconductor film made of a silicon-germanium alloy. In practice, the entire semiconductor film ACTp used for the PMOS transistors is made of a silicon-germanium alloy.

For example, the gate dielectric layers EG of the NMOS transistors and of the PMOS transistors have a thickness tEG, taken vertically Z between the active region ACTn, ACTp and the gate conductive region RG (see below), between 3.5 nanometers and 6 nanometers, or even 7 nanometers.

Advantageously, the gate dielectric layers EG have an equivalent electric thickness of substantially 4 nanometers or less. The equivalent electric thickness corresponds to the thickness t of a dielectric having a reference permittivity ε, for example that of SiO2 silicon dioxide, resulting, at equal surfaces S, at the same capacitive value C according to the formula $C=\varepsilon(S/t)$.

Thus a reduction in the electric thickness allows to increase the capacitive value of the dielectric layer, which is advantageous in terms of performance, without reducing the physical thickness of the dielectric layer, which is advantageous in terms of gate current leakage.

For example, the gate dielectric layers EG can include in this respect a part made of "SiON" silicon oxynitride (or $SiO_xN_y$, typically $Si_2O_2N$), having a thickness between 1 nanometer and 4.5 nanometers, and a part made of "high permittivity" (usually "high-k") dielectric, such as hafnium oxide, having a thickness of substantially 2.5 nanometers, above the part made of silicon oxide. A physical thickness of for example substantially 6 nanometers (3.5+2.5) with these materials corresponds to an equivalent electric thickness of substantially 4 nanometers.

Moreover, the NMOS and PMOS transistors conventionally include a gate conductive region RG located on the gate dielectric layer EG, and including for example a layer made of metal as well as a volume of polycrystalline silicon, as well as source S and drain D regions implanted in respective active regions ACTn, ACTp.

The active regions ACTn, ACTp are located in the semiconductor film of the substrate of the silicon on insulator type, and are defined by lateral isolation structures STI, usually shallow isolation trenches. The active regions ACTn of the NMOS transistors are for example made of intrinsic silicon.

Finally, the NMOS transistors are located facing p-type doped wells PW, implanted in the carrier substrate SUB, and the PMOS transistors are located facing n-type doped wells NW, implanted in the carrier substrate SUB, that is to say in a configuration corresponding to a "regular" structure of wells (as opposed to an "upside-down" structure of wells in which the NMOS transistors are located facing an n-type well of the carrier substrate SUB, and the PMOS transistors facing a p-type well of the carrier substrate SUB).

The "regular" structure of wells advantageously allows to implement reverse back biases of the NMOS and PMOS transistors, because the junctions PN between said wells are blocking in this condition of biases (negative biases in the p-type doped wells and positive in the n-type doped wells). The semiconductor wells PW, NW include in this respect respective contacts P+, N+, typically in an opening of the buried dielectric region BOX formed between two shallow isolation trenches STI, and for example set back from the circuits including the transistors NM, PM.

The back bias conditions BBn, BBp correspond to a field effect in the active region ACTn, ACTp engendered through the buried dielectric region BOX by the bias of the carrier substrate SUB (wells PW, NW). The reverse back bias comprises a negative bias for the NMOS transistors and a positive bias for the PMOS transistors, which allows to "slow down" the operation of the transistors and to reduce the leaks of current towards the carrier substrate SUB.

The semiconductor device DSM includes a bias circuit ALM, for example inside an electric power supply circuit of the device, configured to generate in the respective semiconductor wells PW, NW of the carrier substrate SUB voltages BBn, BBp adapted for reverse back biases of the PMOS and NMOS transistors.

For example, the reverse back bias voltage BBn adapted for the NMOS transistors and applied in the p-type doped wells PW is between 0 volts and −2 volts, and the reverse back bias voltage BBp adapted for the PMOS transistors and applied in the n-type doped wells NW is between 0 volts and +2 volts.

Advantageously, the bias circuit ALM is configured to generate said voltages BBn, BBp of reverse back biases of the PMOS and NMOS transistors, in a mode for retention of a piece of data of said cell-memory CLL and no back bias in a read-write mode of said cell-memory CLL.

Moreover, the bias circuit ALM can be configured to generate a power supply voltage VDD for said cell-memory CLL having a nominal level in the read-write mode, and having 50% to 85% of the nominal level in the mode for retention of a piece of data.

Figure 2:
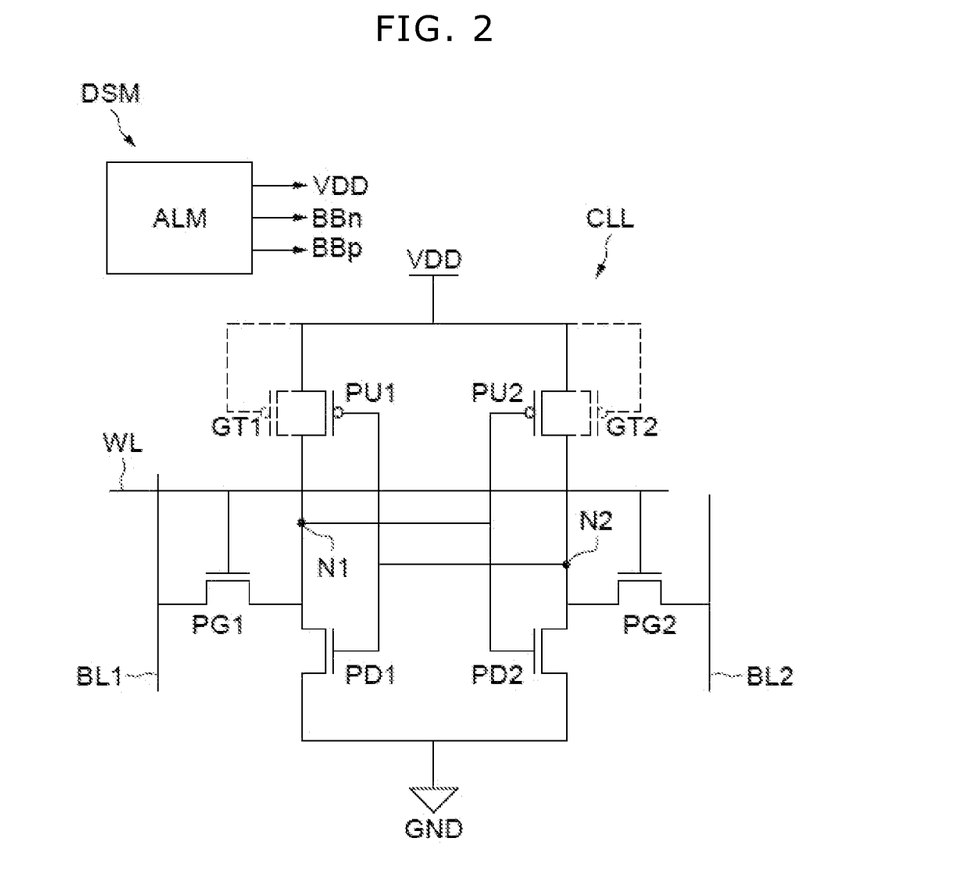
FIG. 2 illustrates an electric diagram of an SRAM memory cell.

In this respect reference is made to FIG. 2.

FIG. 2 illustrates an electric diagram of a memory cell CLL of an SRAM static RAM including NMOS transistors and PMOS transistors as described above in relation to FIG. 1.

The memory cell includes two "pull-up" PMOS transistors PU1, PU2 and two "pull-down" NMOS transistors PD1, PD2 connected between a power supply terminal VDD and a ground terminal GND so as to form two top to tail inverters. The output node N1 of the first inverter PU1, PD1 (or "first piece of data node N1") is coupled to the input of the second inverter PU2, PD2, and the output node N2 (or "second piece of data node N2") of the second inverter PU2, PD2 is coupled to the input of the first inverter PU1, PD1.

Moreover, the cell CLL conventionally includes two access NMOS transistors PG1, PG2 allowing to select the cell for reading and for writing. The first access transistor PG1 is coupled between a bit line BIA and the first data node N1 and is controlled by a signal transmitted on a word line WL. The second access transistor PG2 is coupled between another bit line BL2 and the second data node N2 and is controlled by the signal transmitted on the word line WL.

The writing and the reading of a piece of data in the cell CLL are carried out via the access transistors PG1, PG2, by measuring, via the respective bit line BIA, BL2, the voltage level of at least one of the piece of data nodes N1, N2 when reading, and by imposing, via the respective bit line BL1, BL2, a voltage level on at least one of the data nodes N1, N2 when writing.

The retention of a piece of data in a memory cell is obtained by the steady state of the signal generated on the data nodes N1, N2 of the assembly of the two top to tail inverters PU1-PD1, PU2-PD2.

In the read-write mode, the power supply voltage VDD is generated by the bias circuit ALM at a nominal level, that is to say a level of normal operation of the transistors PU1, PD1, PU2, PD2, for example between 0.8 volts and 1.2 volts, preferably 0.8 volts.

In the retention mode of an SRAM cell, the power supply voltage VDD is generated by the bias circuit ALM at an economical level, for example 50% to 85% of the nominal level, that is to say between 0.4 volts and 1.0 volts, preferably at substantially 0.6 volts.

Figure 3:
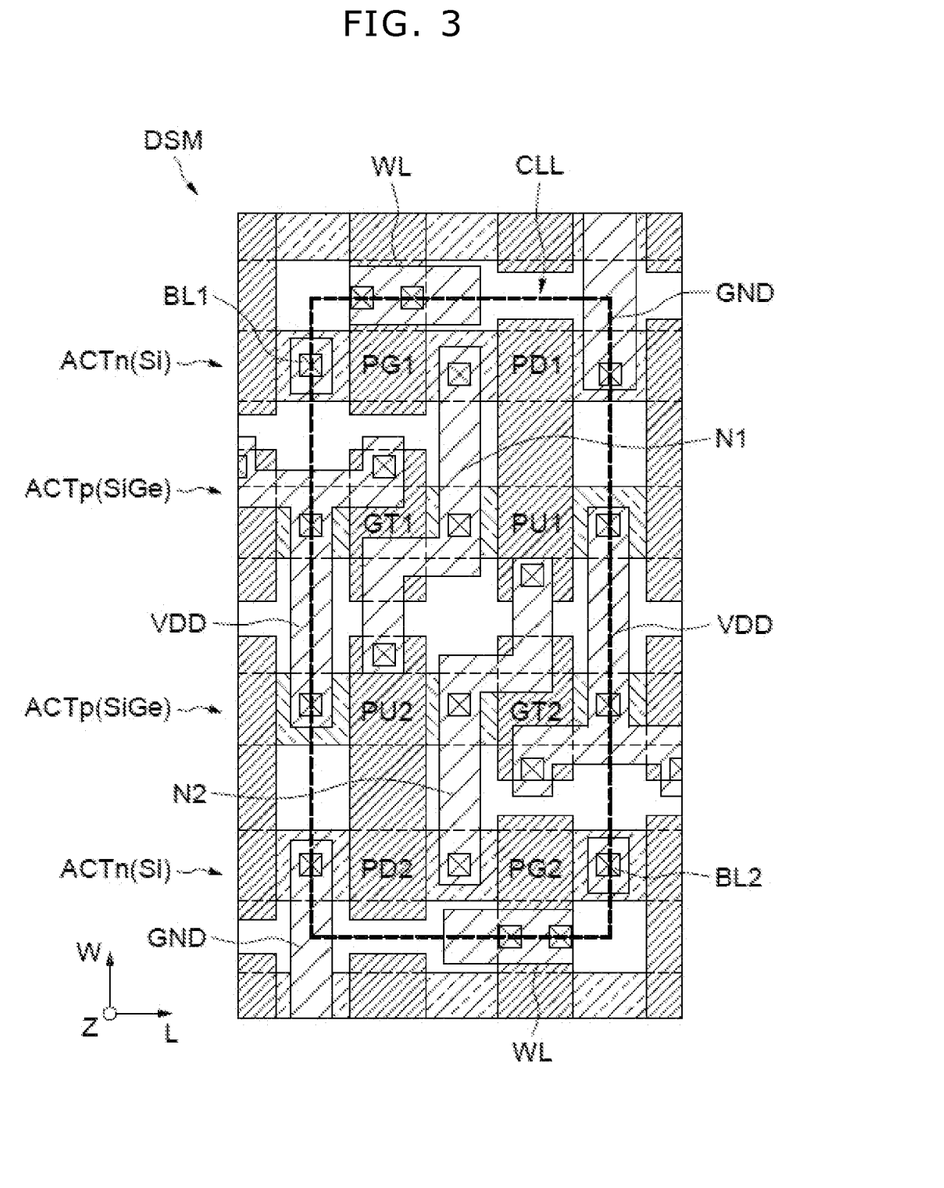
FIG. 3 illustrates an example of a layout in a top view of the circuit of a memory cell as described above in relation to FIGS. 1 and 2.

FIG. 3 illustrates an example of a layout in a top view of the circuit of a memory cell CLL as described above in relation to FIGS. 1 and 2.

The same elements carry the same references as in FIGS. 1 and 2 and will not all be described in detail again here.

It is noted in particular that the active regions ACTn (Si), ACTp (SiGe) extend in the memory circuit along a first direction L, on either side of the contour of the memory cell CLL, thus incorporating neighboring cell-memories (to the left and to the right of the cell CLL, in the orientation of FIG. 3).

This corresponds to a "continuous active region" architecture of the active regions made of a silicon-germanium alloy ACTp (SiGe) of the PMOS transistors.

This allows to not relax a compression stress in the first direction L of the silicon-germanium alloy ACTp (SiGe) and thus to take advantage of improvements in the performance of the PMOS transistors, in particular a reduction of the threshold voltage of the PMOS transistors, and a low variability in the threshold voltages of the PMOS transistors.

However, this engenders a creation of a "parasite" transistor GT1, GT2 in each of the active regions ACTp of the functional pull-up PMOS transistors PU1, PU2 for the cell CLL. The two parasite PMOS transistors GT1, GT2 are deactivated by connecting their gates and their sources to the power supply voltage terminal VDD, and are usually called in this respect "gate tied transistors." In FIG. 2, the parasite PMOS transistors GT1, GT2 are shown in dotted lines because of their presence but their deactivated state.

The gate tied transistors GT1, GT2 can introduce an additional leak current to that of the memory cell CLL in off mode or in retention mode (usually "in off-state mode"), but negligible with respect to the consumption of the memory cell in read/write mode. That being said, even in off mode or in retention mode, the leaks of the "gate tied" transistor are low, because of the thickness of its gate dielectric layer, greater than 3 nanometers, and a large gate length (in the first direction L), for example greater than 100 nm.

The first direction L corresponds to the length of the transistors, that is to say in the source-drain direction of the transistors. The width W of the transistors is defined by the extension of the active regions in a second direction W perpendicular to the first direction L and to the vertical direction Z.

For example, the NMOS and PMOS transistors of the cell CLL can have a channel length, in the first direction L, between 100 nm and 200 nm, and a channel width, in the second direction W, between 100 nm and 200 nm. The lengths (L) and widths (W) of the transistors of the cell CLL are relatively bulky, but allow, with respect to the thickness of the gate dielectric layer EG, to respectively ensure good electrostatic control of the carriers in the channel (and thus less leaks between the source and drain regions), and a conduction current sufficient for the operation of the SRAM memory cell.

That being said, the current leaks in a memory cell CLL as described in relation to FIGS. 1 to 3 are extremely low, for example substantially fifty times less than the leaks of currents of the "ultra low leakage" memory cells.

Figure 4:
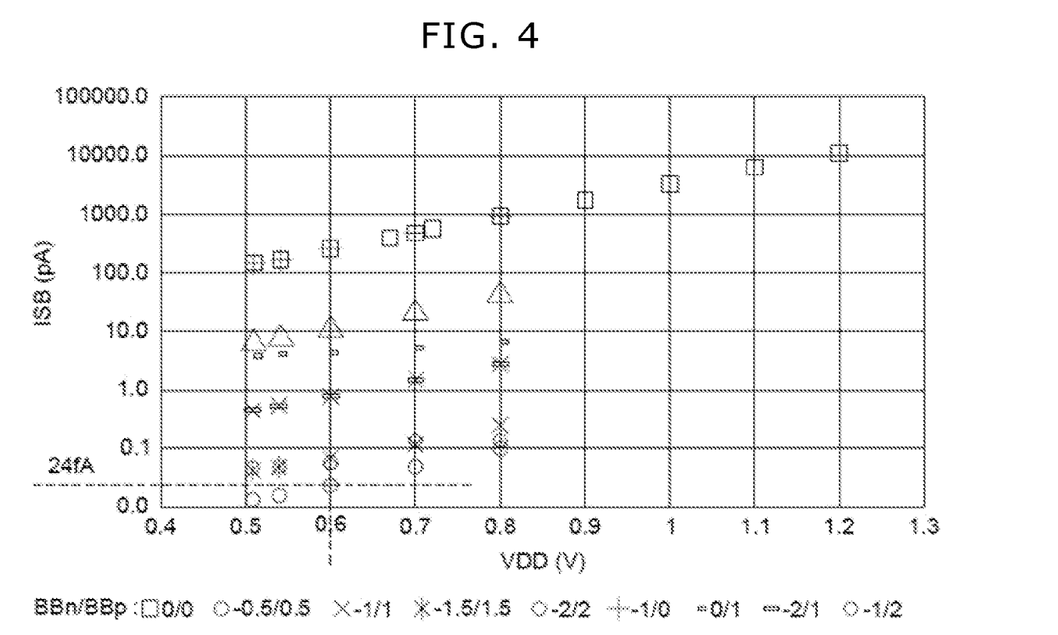
FIG. 4 illustrates results of the intensity of the current leaks of a memory cell.

Reference is made in this respect to FIG. 4.

FIG. 4 illustrates results of the intensity of the current leaks ISB, in picoamperes (10-12 A), of a memory cell CLL as described above in relation to FIGS. 1 to 3, in retention mode, according to the level of the power supply voltage VDD, in volts, and for various reverse back biases BBn/BBp.

It is noted that at a power supply voltage VDD of 0.6 volts in retention mode, with reverse back biases at BBn=2 volts and BBp=+2 volts (BBn/BBp: 2/2), the intensity of the current leaks ISB in the memory cell CLL is substantially 24 femtoamperes (24×10-15 A).

For comparison, the cells of conventional ultra low leakage SRAM memories using FDSOI technology have leaks of approximately 1 to 1.5 picoamperes in retention mode. In other words, the memory cell CLL as described above in relation to FIGS. 1 to 3 has current leaks 50 times smaller than the conventional technologies.

It is further noted that other power supply voltage VDD and/or back bias BBn/BBp conditions give satisfactory results. For example: at a power supply voltage VDD of 0.8 volts with reverse back biases at BBn/BBp: 2/2, the intensity of the current leaks ISB in the memory cell CLL is less than 100 femtoamperes; at a power supply voltage VDD of 0.6 volts with reverse back biases at BBn/BBp: 1/1, the intensity of the current leaks ISB in the memory cell CLL is less than 1 picoampere.

Figure 5:
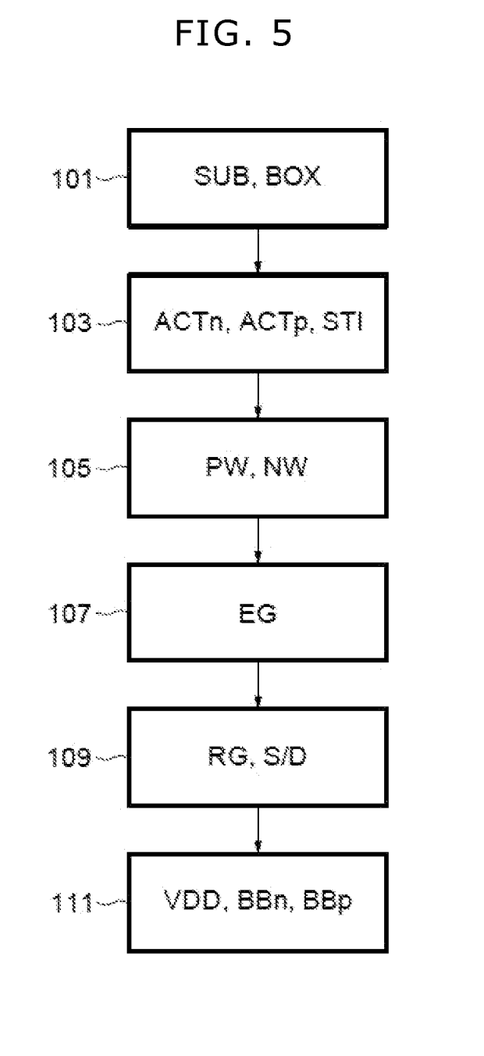
FIG. 5 illustrates a simplified example of a method for manufacturing a semiconductor device.

FIG. 5 illustrates a simplified example of a method for manufacturing a semiconductor device DSM as described above in relation to FIGS. 1 to 4, in particular the manufacturing of the NMOS and PMOS transistors of the memory cells CLL.

In a step 101, the substrate of the silicon on insulator type comprising a semiconductor film made of intrinsic silicon (ACT), separated from a carrier substrate SUB by a buried dielectric region BOX, was prepared.

In a step 103, the material (initially intrinsic silicon) in the active regions ACTp of the future PMOS transistors is modified, for example via a technique usually called "condensation." The condensation technique comprises first a growth via epitaxy selective of silicon-germanium on the semiconductor film made of intrinsic silicon of the zones receiving the PMOS transistors. Then, the germanium is made to diffuse in depth (downward) in the semiconductor film. The diffusion is carried out by oxidation of the epitaxial region, the oxide that results therefrom is then removed, and an active region ACTp made of a silicon-germanium alloy has been formed locally. The active regions ACTn of the future NMOS transistors are preserved in intrinsic silicon.

In the step 103 shallow isolation trenches STI have also been formed so as to define the active regions ACTn, ACTp of the future NMOS and PMOS transistors and contacts in future wells of the carrier substrate SUB.

In a step 105, the wells NW, PW have been formed in the carrier substrate SUB by implantation of dopants of respective types.

In a step 107, the gate dielectric layers EG of the future NMOS and PMOS transistors are formed, for example by depositing on the entire front face of the substrate a dielectric layer EG, or a superposition of dielectric layers, having a total thickness greater than 3 nm, for example between 3.5 nm and 4.5 nm.

In a step 109 the gate conductive regions RG of the NMOS and PMOS transistors are formed, for example by depositing on the entire dielectric layer EG a conductive structure RG that can include a layer of metal and a volume of polycrystalline silicon on top.

The various structures of gates EG, RG of the NMOS and PMOS transistors are then defined by etching, typically by photolithography, removing the gate conductive region RG and the gate dielectric layer EG in the parts located outside of the pattern of a mask. In FIG. 3, the zones filled by the tightest rising oblique hatchings ("RG" in FIG. 1) represent the result of the etching of the gate structures EG, RG, and correspond substantially to the pattern of the mask.

After the definition of the structures of gates EG, RG of the NMOS and PMOS transistors, the source and drain regions S/D are implanted in the active regions ACTn, ACTp in a self-aligned manner on the gate structures EG, RG, that is to say in the parts of the active regions ACTn, ACTp which are not masked by the gate structures EG, RG.

On the one hand, the NMOS and PMOS transistors of the memory cells are electrically connected via vertical metal vias and metal tracks, for example as shown in FIG. 3, in which the squares filled with a cross in the two diagonals correspond to the locations of the vias, and in which the zones filled by the least tight rising oblique hatchings (VDD, N1, N2, WL, BL1, BL2) correspond to the metal tracks.

Thus, in a step in, the memory cells CLL are functional and can be powered, for example at a power supply voltage VDD between 0.8 volts and 1.2 volts (0.8V VDD 1.2V) and without back bias (BBn=BBp=0V) in the read-write operating mode, and at a power supply voltage VDD of substantially 0.6 volts (VDD=0.6V) and with reverse back biases BBn, BBp of substantially 2 volts in the p-type wells PW and substantially +2 volts in the n-type wells NW (BBn=2 V; BBp=+2V) in the retention operating mode.

Moreover, the method for manufacturing the memory cells advantageously uses manufacturing steps that can also already be planned in a conventional manufacturing method, and thus be carried out in a completely co-integrated manner and without additional cost. Indeed, circuits of the semiconductor device DSM other than the static RAM circuit can incorporate "medium voltage" transistors, that is to say transistors having gate dielectric layers having thicknesses between 3.5 nm and 4.5 nm and intended to operate at voltages between 1.2 volts and 1.8 volts, for which the manufacturing steps substantially correspond to the manufacturing steps 101-111 of the NMOS and PMOS transistors. Moreover, the other circuits of the semiconductor device DSM can incorporate "low voltage" transistors, that is to say transistors having gate dielectric layers having thicknesses between mm and 1.5 nm and intended to operate at voltages between 0.5 volts and 1.2 volts.

In summary, implementations of a static RAM cell of a semiconductor device DSM of the FDSOI type, including NMOS transistors and PMOS transistors in a configuration with regular wells allowing to apply a reverse back bias independently on the NMOS and PMOS transistors, have been described. The thickness greater than 3 nanometers of the gate dielectric layers EG allows to eliminate the gate current leaks. The active regions ACTp of the PMOS transistors made of silicon-germanium alloy under a compression stress in the direction L of the channel allow to lower the threshold voltage of the PMOS transistors, and thus to ensure sufficient stability in reading and in writing. The continuous active region ACTp architecture of the PMOS transistors allows to avoid the relaxing of the compression stress of the silicon-germanium alloy, which consequently avoids a variability and an increase in the threshold voltage of the PMOS transistors. Moreover, the method for manufacturing the memory cells can use conventional manufacturing steps, and thus be implemented in an entirely co-integrated manner without additional dedicated cost.

What is claimed is:

1. A semiconductor device comprising:
   a carrier substrate;
   a buried dielectric region overlying the carrier substrate;
   a semiconductor film separated from the carrier substrate by the buried dielectric region; and
   NMOS transistors and PMOS transistors disposed at a surface of the semiconductor film and coupled together to form a static random access memory (SRAM) cell, the NMOS transistors and the PMOS transistors each comprising a gate dielectric layer having a thickness greater than 3 nanometers and an active region in the semiconductor film, the active region of the PMOS transistors comprising a silicon-germanium alloy.

2. The device according to claim 1, wherein the gate dielectric layers of the NMOS transistors and of the PMOS transistors have a thickness, taken between the active region and a gate conductive region, between 3.5 nanometers and 6 nanometers.

3. The device according to claim 1, further comprising a plurality of further PMOS transistors each having an active region being made of the silicon-germanium alloy, wherein the active regions of a plurality of the PMOS transistor extend along a first direction.

4. The device according to claim 3, wherein the further PMOS transistors are coupled to further NMOS transistors to form further SRAM cells, wherein the active regions of the further PMOS transistors and active regions of the NMOS transistors extend along the first direction so as to incorporate other SRAM cells.

5. The device according to claim 3, wherein the active regions of the plurality of the PMOS transistors extend along the first direction so as to not relax a compression stress in the first direction of the silicon-germanium alloy.

6. The device according to claim 1, wherein the NMOS transistors and the PMOS transistors are located in respectively doped wells of the carrier substrate, the device further comprising a bias circuit coupled to the doped wells of the carrier substrate.

7. The device according to claim 6, wherein the bias circuit is configured to generate, in the respectively doped wells of the carrier substrate, voltages adapted for reverse back biases of the PMOS and NMOS transistors.

8. The device according to claim 6, wherein the NMOS transistors are located in p-type doped wells in the carrier substrate, the PMOS transistors are located in n-type doped wells in the carrier substrate.

9. The device according to claim 8, wherein the bias circuit is configured to generate a reverse back bias voltage between 0 volts and −2 volts in the p-type doped wells.

10. The device according to claim 8, wherein the bias circuit is configured to generate a reverse back bias voltage between 0 volts and +2 volts in the n-type doped wells.

11. The device according to claim 6, wherein the bias circuit is configured to generate voltages adapted for reverse back biases of the PMOS and NMOS transistors, in a mode for retention of a piece of data of the memory cell and not in a read-write mode of the memory cell.

12. The device according to claim 6, wherein the bias circuit is configured to generate a power supply voltage for the memory cell having a nominal level in a read-write mode and a voltage of 50% to 85% of the nominal level in a mode for retention of a piece of data.

13. A method of operating a static random access memory formed from NMOS transistors and PMOS transistors disposed a surface of a semiconductor film that is separated from a carrier substrate by a buried dielectric region, wherein the NMOS transistors and the PMOS transistors each comprise a gate dielectric layer having a thickness greater than 3 nanometers and an active region in the semiconductor film and wherein the active region of the PMOS transistors comprises a silicon-germanium alloy, the method comprising:
operating the memory in a read-write mode, wherein the NMOS transistors and the PMOS transistors are back biased to a nominal voltage in the read-write mode; and
operating the memory in a retention mode, wherein the NMOS transistors and the PMOS transistors are back biased to a voltage that is 50% to 85% of the nominal voltage in the retention mode.

14. The method of claim 13, further comprising applying a reverse back bias voltage between 0 volts and −2 volts to p-type doped wells of the NMOS transistors.

15. The method of claim 13, further comprising applying a reverse back bias voltage between 0 volts and +2 volts to n-type doped wells of the PMOS transistors.

16. A method of forming a semiconductor device in a semiconductor film separated from a carrier substrate by a buried dielectric region, the method comprising:
forming NMOS transistors and PMOS transistors at a surface of the semiconductor film; and
coupling the NMOS transistors and the PMOS transistors together to form a plurality of static random access memory (SRAM) cells;
wherein the NMOS transistors and the PMOS transistors each comprise a gate dielectric layer having a thickness greater than 3 nanometers;
wherein the NMOS transistors comprise an active region of silicon in the semiconductor film; and
wherein the PMOS transistors comprise an active regions of a silicon-germanium alloy in the semiconductor film.

17. The method according to claim 16, wherein forming the NMOS transistors and the PMOS transistors comprises:
modifying a silicon film in an area of the active regions of the PMOS transistors to form the silicon-germanium alloy;
forming shallow isolation trenches to define the active regions;
forming n-type doped wells of the PMOS transistors in the carrier substrate;
forming p-type doped wells of the NMOS transistors in the carrier substrate;
forming the gate dielectric layer;
forming a gate conductive layer over the gate dielectric layer;
patterning the gate conductive layer to form gate conductive regions;
forming source and drain regions for the NMOS transistors and the PMOS transistors; and
interconnecting the NMOS transistors and the PMOS transistors to form the SRAM cells.

18. The method according to claim 17, wherein modifying the silicon film comprises implementing a condensation technique.

19. The method according to claim 17, wherein the gate dielectric layer is formed to a thickness between 3.5 nm and 6 nm.

20. The method according to claim 16, wherein the active regions are formed so as to extend along a first direction so as to incorporate a plurality of the SRAM cells.

21. The method according to claim 20, wherein the active regions are formed so as to extend along the first direction so as to not relax a compression stress in the first direction of the silicon-germanium alloy.

22. The method according to claim 16, further comprising manufacturing a bias circuit electrically coupled to n-type doped wells of the PMOS transistors and p-type doped wells of the NMOS transistors.

* * * * *